United States Patent

Shih

[11] Patent Number: 5,973,947
[45] Date of Patent: Oct. 26, 1999

[54] POWER SUPPLYING APPARATUS WITH MULTIPLE POWER-SUPPLYING UNITS

[75] Inventor: Tsun-Te Shih, Taipei Hsien, Taiwan

[73] Assignee: Shin Jiuh Corp., Taiwan

[21] Appl. No.: 09/245,015

[22] Filed: Feb. 4, 1999

[51] Int. Cl.[6] .................................................. H02H 1/00
[52] U.S. Cl. ............................................................ 363/144
[58] Field of Search ............................... 363/67, 69, 142, 363/144, 146

[56] References Cited

U.S. PATENT DOCUMENTS

| | | | |
|---|---|---|---|
| 4,685,028 | 8/1987 | Miller et al. | 361/334 |
| 5,398,161 | 3/1995 | Roy | 361/727 |
| 5,600,550 | 2/1997 | Cook, II | 363/50 |
| 5,613,863 | 3/1997 | Klaus et al. | 439/131 |

Primary Examiner—Matthew Nguyen
Attorney, Agent, or Firm—Brinks Hofer Gilson & Lione

[57] ABSTRACT

A power supplying apparatus includes a housing with a plurality of storage compartments and a box-receiving compartment. A rear cover is mounted on the housing to close an open rear side of the latter. A circuit board unit is mounted on an inner surface of the rear cover. Each of a plurality of power-supplying units is disposed removably in a respective one of the storage compartments, and has an internal power supply circuit and an internal isolating circuit. A first set of complementary connectors interconnects the power-supplying units and the circuit board unit. A control box has a casing received removably in the box-receiving compartment, and a control circuit disposed in the casing. The control circuit includes a detecting and alarm generating circuit and a load balancing circuit, and is connected to the circuit board unit via a second set of complementary connectors.

6 Claims, 5 Drawing Sheets

POWER SUPPLYING APPARATUS WITH MULTIPLE POWER-SUPPLYING UNITS

BACKGROUND OF THE INVENTION

1. Field of the Invention

The invention relates to a power supplying apparatus, more particularly to a power supplying apparatus that includes multiple power-supplying units and that facilitates maintenance and repair of the same.

2. Description of the Related Art

Referring to FIG. 1, a conventional power supplying apparatus 1 for supplying electric power to electronic equipment is shown to comprise a housing 11 that is formed with a plurality of storage compartments 10. A power-supplying unit 12 is slidably disposed in each of the storage compartments 10. The housing 11 has an open rear side that is closed by a rear cover 110. A circuit board unit 13 is mounted on an inner surface of the rear cover 110 by means of screws.

With reference to FIG. 2, pairs of complementary male and female connectors 120, 130 are mounted on the rear side of each power-supplying unit 12 and on the circuit board unit 13. When the power-supplying unit 12 is disposed in the storage compartment 10, the connector 120 thereon engages the corresponding connector 130 on the circuit board unit 13 to establish electrical connection between the power-supplying unit 12 and the circuit board unit 13. Each connector 130 is connected to a respective isolating circuit 131 on the circuit board unit 13 in order to ensure that malfunctioning of one of the power-supplying units 12 will not affect normal operation of the other power-supplying units 12.

In use, an alternating current (AC) input to each of the power-supplying units 12 will be converted into a direct current (DC) power signal by a power supply circuit 121 in the latter. The DC power signals pass through the respective isolating circuit 131 before reaching a DC output circuit 132 and a DC output bus connected to the DC output circuit 132.

The circuit board unit 13 further has a detecting and alarm generating circuit 133 and a load balancing circuit 134 connected to each of the connectors 130. The detecting and alarm generating circuit 133 generates an alarm signal upon detecting the malfunctioning of any one of the power-supplying units 12. The load balancing circuit 134 operates to balance the power outputs of the power-supplying units 12.

Some of the drawbacks of the conventional power supplying apparatus 1 are as follows:

The isolating circuits 131, the detecting and alarm generating circuit 133 and the load balancing circuit 134 are all disposed on the circuit board unit 13. When any of these circuits fail, the circuit board unit 13 must be removed for replacement with a new one. During the replacement operation, it is necessary to turn off a main power switch (not shown) of the power supplying apparatus 1, to remove each of the power-supplying units 12 from the respective storage compartment 10, and to detach the rear cover 110 from the housing 11. Only then can the malfunctioning circuit board unit 13 be removed from the rear cover 110 to facilitate testing and repairing thereof, and can the new circuit board unit 13 be installed. Thus, maintenance and repair of the conventional power supplying apparatus 1 is both inconvenient and time consuming to conduct. In addition, since the main power switch of the power supplying apparatus 1 must be turned off when replacing the circuit board unit 13, the normal operation of the electronic equipment connected to the power supplying apparatus 1 is interrupted as well, thereby resulting in more inconvenience.

SUMMARY OF THE INVENTION

Therefore, the main object of the present invention is to provide a power supplying apparatus that includes multiple power-supplying units and that facilitates maintenance and repair of the same.

Accordingly, the power supplying apparatus of the present invention comprises:

a housing having an open front side, an open rear side, and a plurality of storage compartments and a box-receiving compartment that extend from the front side to the rear side;

a rear cover mounted on the housing to close the rear side, the rear cover having an inner surface with a circuit board unit mounted thereon, the circuit board unit having a plurality of first connectors, each of which is registered with a respective one of the storage compartments, a direct current output circuit connected to the first connectors, and a second connector registered with the box-receiving compartment and connected to the direct current output circuit;

a plurality of power supplying units, each of which is inserted removably in a respective one of the storage compartments, each of the power supplying units having a rear side provided with a third connector which complements a corresponding one of the first connectors that is registered with the respective storage compartment, the third connector engaging the corresponding first connector to establish electrical connection with the circuit board unit, each of the power supplying units further having an internal power supply circuit adapted to receive an alternating current input and to convert the alternating current input into a direct current power signal, and an internal isolating circuit that interconnects the power supply circuit and the third connector, the isolating circuit preventing malfunction of the power-supplying unit from affecting normal operation of other ones of the power-supplying units; and a control box having a casing inserted removably in the box-receiving compartment, and a control circuit disposed in the casing, the control circuit including a fourth connector which projects rearward from a rear side of the casing and which complements the second connector, the fourth connector engaging the second connector to establish electrical connection with the circuit board unit, the control circuit further including a detecting and alarm generating circuit connected to the fourth connector and operable so as to detect malfunctioning of any one of the power-supplying units and so as to generate an alarm signal upon detecting the malfunctioning of any one of the power-supplying units, and a load balancing circuit connected to the fourth connector and operable so as to balance power outputs of the power-supplying units.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
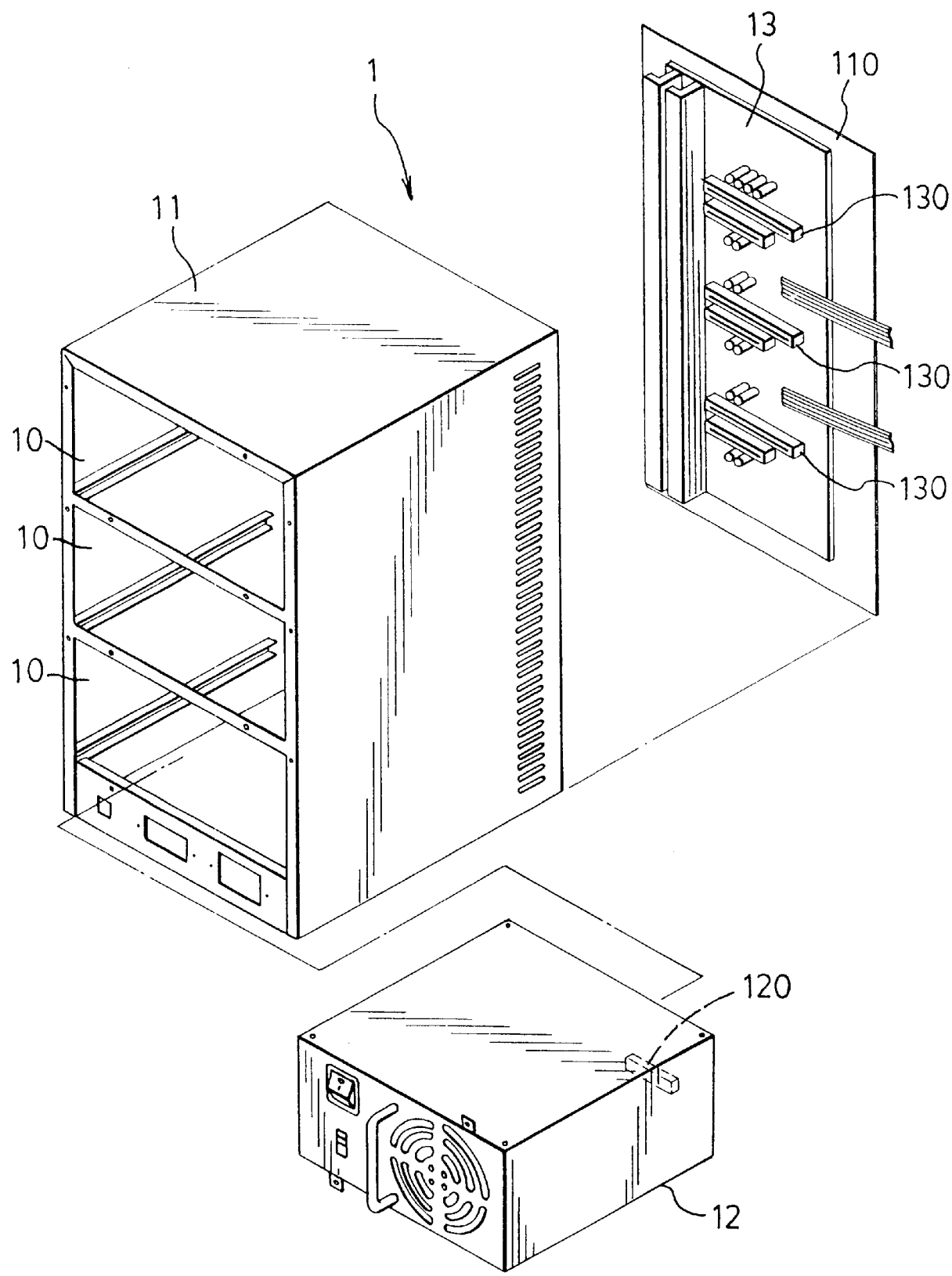
FIG. 1 is an exploded perspective view of a conventional power supplying apparatus.
Figure 2:
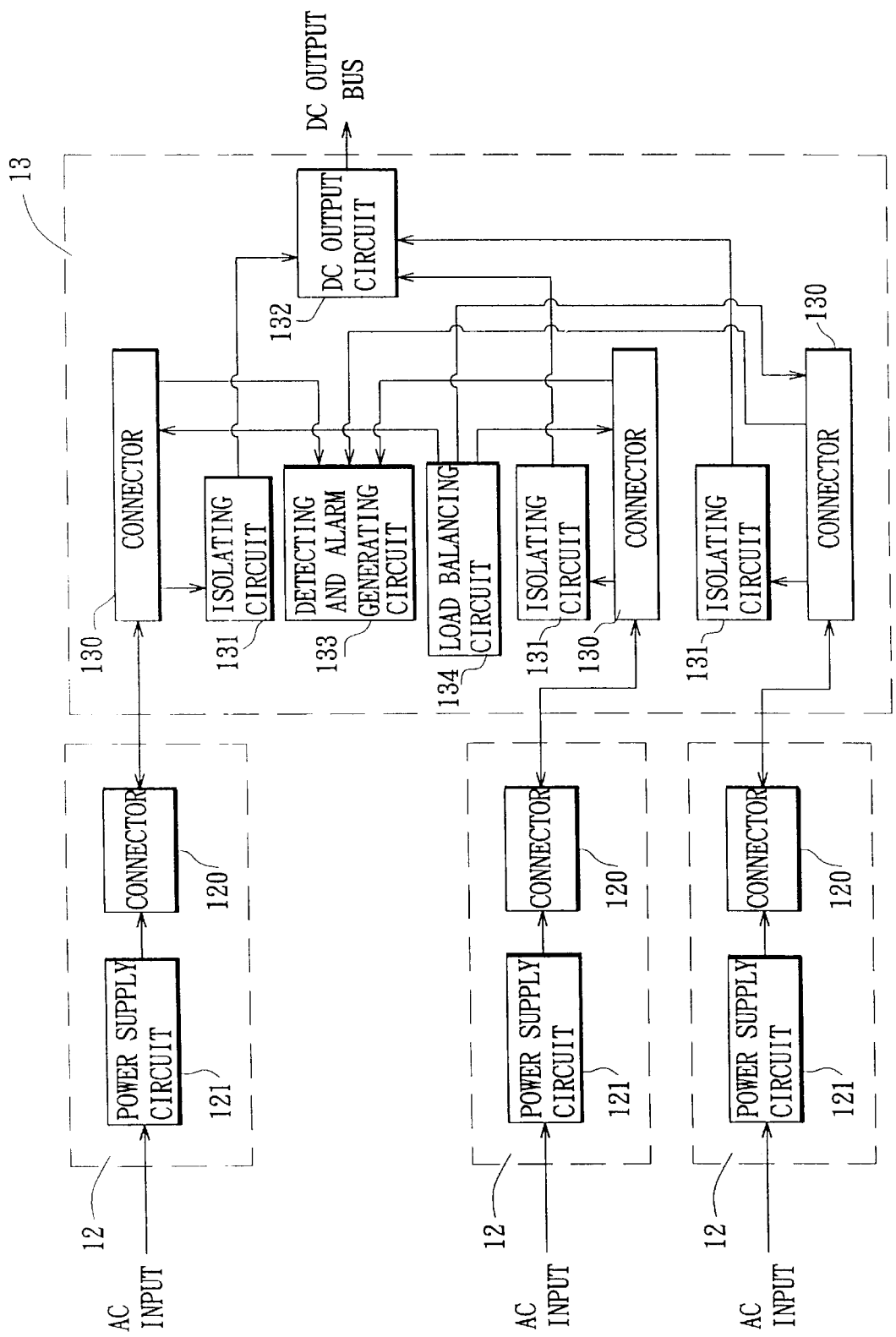
FIG. 2 is a schematic circuit block diagram of the conventional power supplying apparatus.
Figure 3:
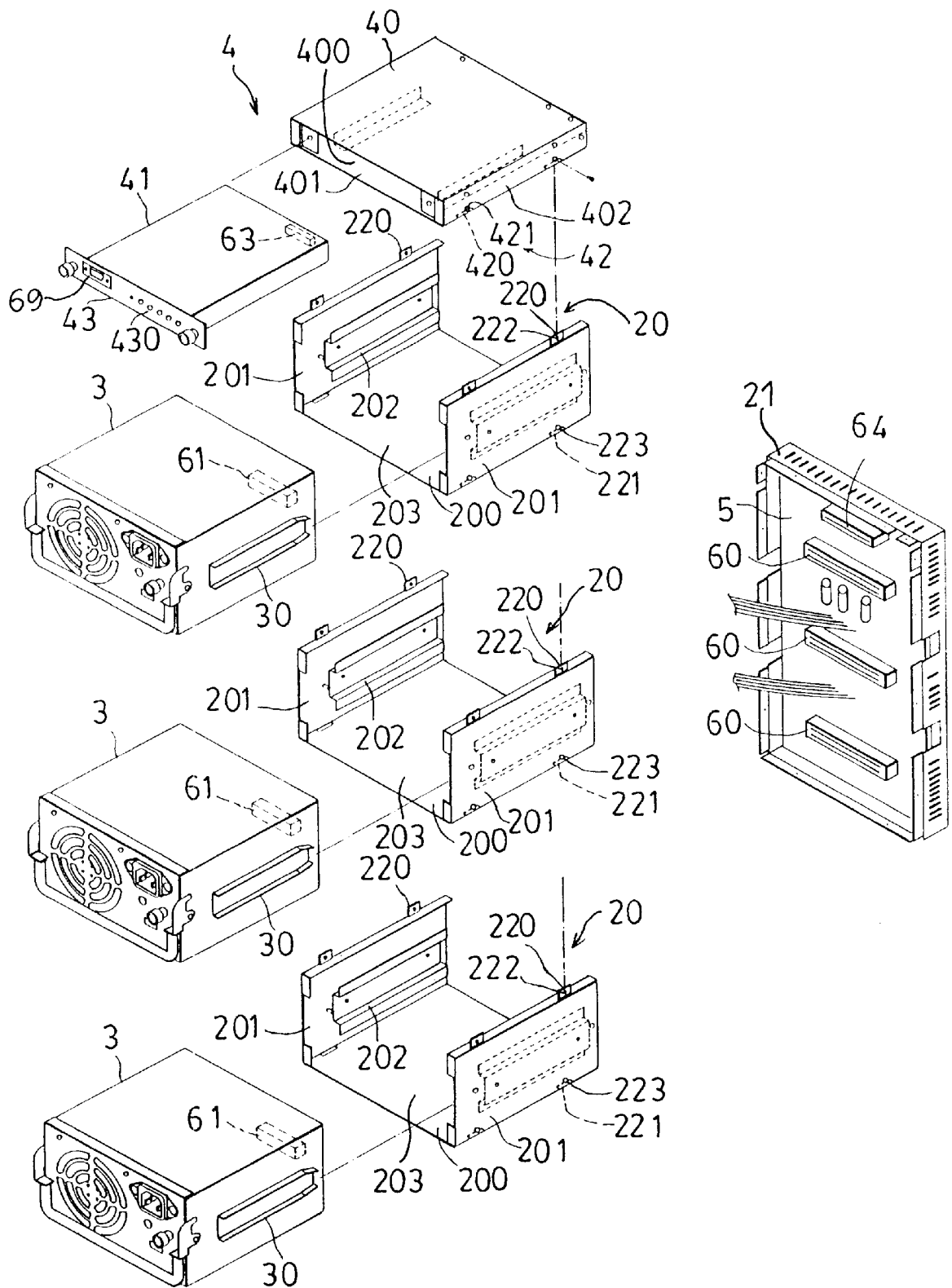
FIG. 3 is an exploded perspective view of the preferred embodiment of a power supplying apparatus according to the present invention.
Figure 4:
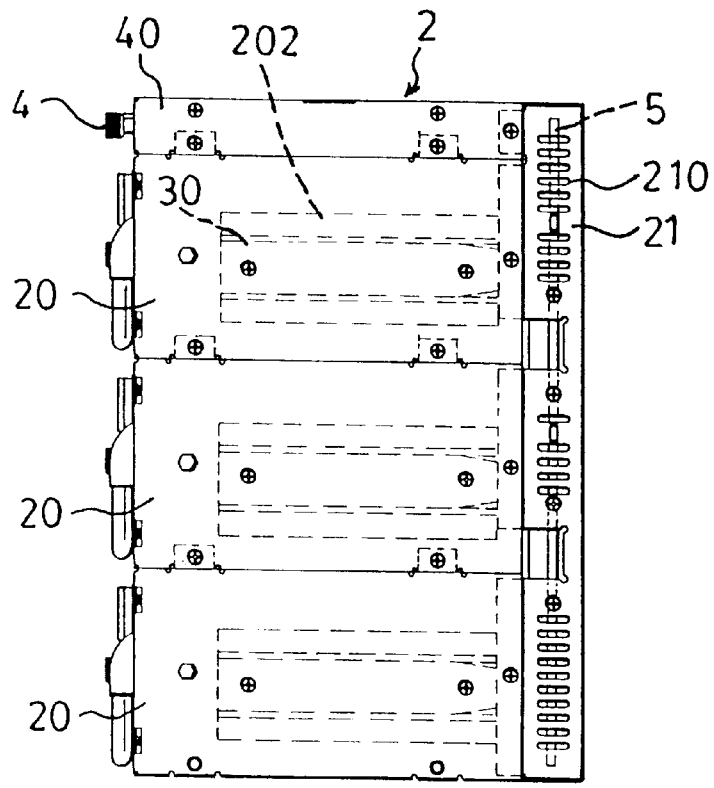
FIG. 4 is a schematic side view of the preferred embodiment.
Figure 5:
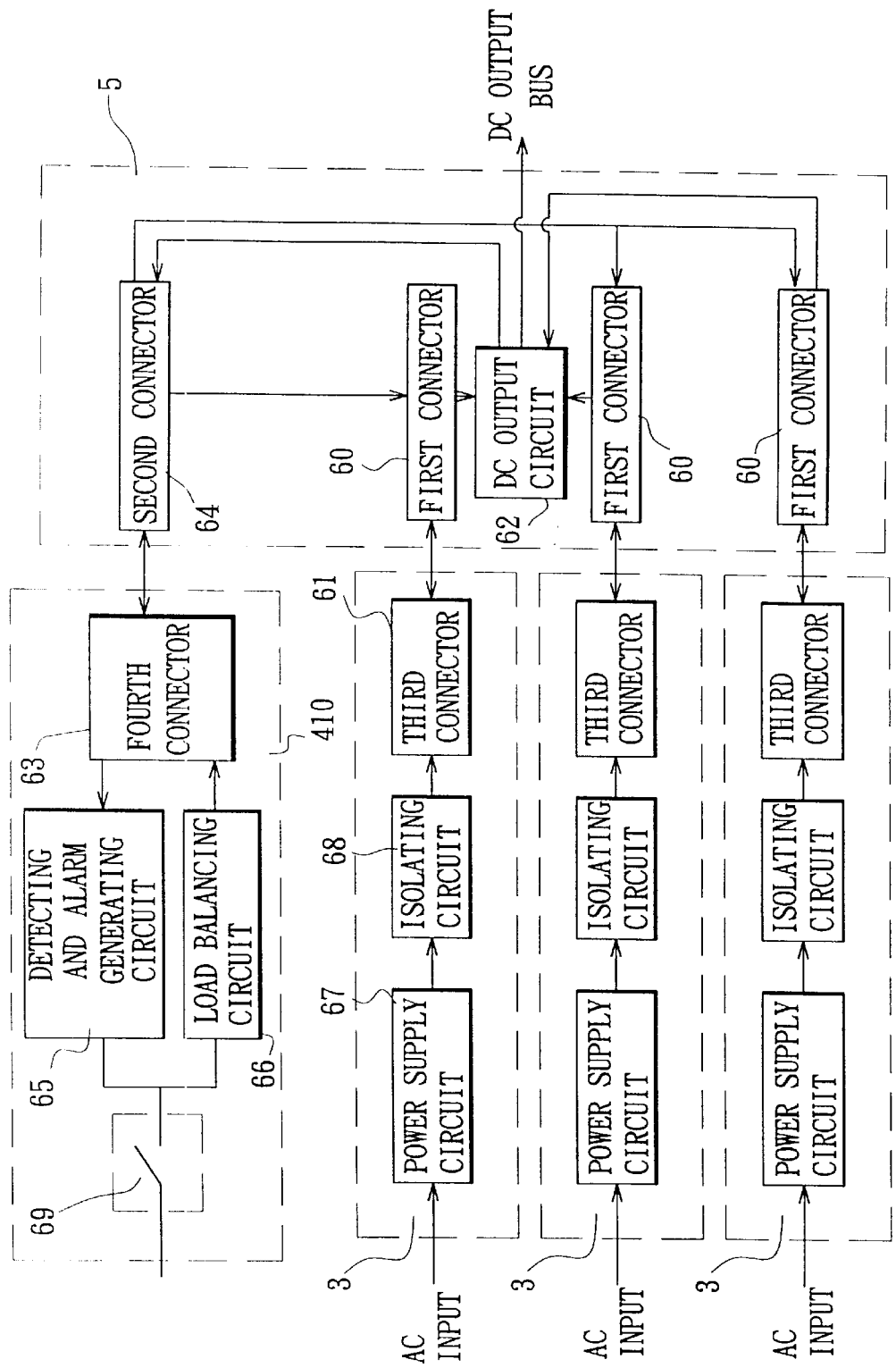
FIG. 5 is a schematic circuit block diagram of the preferred embodiment.

Referring to FIGS. 3 to 5, the preferred embodiment of a power supplying apparatus according to the present invention is shown to comprise a housing 2, a circuit board unit 5, a plurality of power-supplying units 3, and a control box 4.

The housing 2 includes a plurality of container modules 20 that are stacked one above the other. A box-receiving module 40 is disposed on top of the stacked container modules 20. In this embodiment, the housing 2 includes three container modules 20. Each of the container modules 20 confines a storage compartment 200. The box-receiving module 40 confines a receiving compartment 400. Each of the storage compartments 200 and the box-receiving compartment 400 extends from an open front side to an open rear side of the housing 2. A rear cover 21 is mounted on the housing 2 to close the open rear side. The rear cover 21 extends from the top of the box-receiving module 40 to the bottom of the stacked container modules 20.

Each of the container modules 20 is formed from a bent plate which includes a base plate 203 and two opposite side plates 201 folded upwardly at two opposite edges of the base plate 203 to form a U-shape. Two opposite slide rails 202 are attached respectively to inner sides of the side plates 201 and extend into the storage compartment 200. Each of the container modules 20 is further provided with an engaging unit so that the container modules 20 can be interconnected to form the housing 2.

Figure 6:
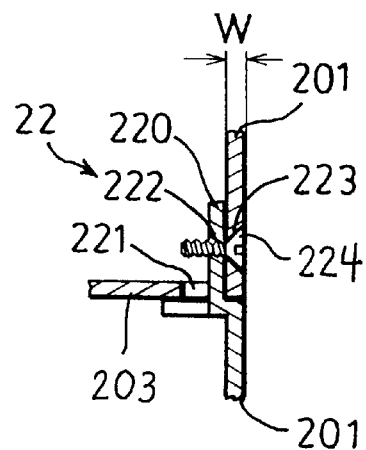
FIG. 6 is a fragmentary sectional view of a housing of the preferred embodiment.

Referring to FIGS. 3 and 6, the engaging unit 22 includes two pairs of ear pieces 220 and two pairs of engaging slits 221. Each of the pairs of ear pieces 220 extends upwardly from a top edge of a respective one of the side plates 201. Each of the pairs of engaging slits 221 is formed in the base plate 203 adjacent to a respective one of the side plates 201. The pairs of ear pieces 220 on a lower one of the container modules 20 extend through the pairs of engaging slits 221 in an upper one of the container modules 20 such that the ear pieces 220 on the lower one of the container modules 20 abut against the inner sides of the side plates 201 of the upper one of the container modules 20. Each ear piece 220 is formed with a screw hole 222. Each side plate 201 is formed with a pair of through holes 223 adjacent to the engaging slits 221. Screws 224 (only one is shown in FIG. 6) extend through the through holes 223 and engage the screw holes 222 so as to fasten the ear pieces 220 of the lower container module 20 to the side plates 201 of the upper container module 20. Preferably, the ear pieces 220 form an offset (W) with the outer side of the corresponding side plate 201 and equal to a wall thickness of the corresponding side plate 201 so that the outer sides of the side plates 201 of the stacked container modules 20 are flush with one another.

The box-receiving module 40 is provided with an engaging unit 42 for mounting the same on an uppermost one of the stacked container modules 20. The engaging unit 42 includes two pairs of engaging slits 420 and two pairs of through holes 421. The pairs of engaging slits 420 are formed in a base plate 401 of the box-receiving module 40 adjacent to a respective one of opposite side plates 402 of the box-receiving module 40. The pairs of ear pieces 220 on the side plates 201 of the uppermost one of the stacked container modules 20 extend through the pairs of engaging slits 420 such that the ear pieces 220 abut against inner sides of the side plates 402 of the box-receiving module 41. Each of the pairs of through holes 421 is formed in a respective one of the side plates 402 adjacent to the engaging slits 420. Screws extend through the through holes 421 and engage the screw holes 222 in the ear pieces 220 so as to fasten the ear pieces 220 on the uppermost one of the container modules 20 to the side plates 402 of the box-receiving module 41.

Referring again to FIGS. 3 to 5, a circuit board unit 5 is mounted on an inner surface of the rear cover 21. The circuit board unit 5 has a plurality of first connectors 60. In this embodiment, there are three first connectors 60 that are registered respectively with the storage compartments 200 of the container modules 20. The circuit board unit 5 further has a DC output circuit 62 connected to the first connectors 60, and a second connector 64 that is registered with the box-receiving compartment 400 of the box-receiving module 40. The second connector 64 is connected to the first connectors 60 and the DC output circuit 62. The rear cover 21 is further formed with heat dissipating holes 210.

Each of the power-supplying units 3 is provided with a pair of slide members 30 on two opposite sides thereof for sliding engagement with the slide rails 202 in the storage compartment 200 of a respective one of the container modules 20. Thus, the power-supplying units 3 are inserted slidably and removably in the storage compartments 200 in a direction from the open front side to the open rear side of the housing 2. Each of the power-supplying units 3 has a rear side provided with a third connector 61 which complements a corresponding one of the first connectors 60 that is registered with the respective storage compartment 200. As such, when the power-supplying unit 3 is disposed in the respective storage compartment 200, the third connector 61 thereon engages the corresponding first connector 60 on the circuit board unit 5 to establish electrical connection between the power-supplying unit 3 and the circuit board unit 5. Each of the power-supplying units 3 has an internal power supply circuit 67 adapted to receive an AC input and to convert the AC input into a DC power signal, and an internal isolating circuit 68 that interconnects the power supply circuit 67 and the third connector 61. The isolating circuit 68 prevents malfunctioning of the respective power-supplying unit 3 from affecting normal operation of the other power-supplying units 3. As to the detailed configuration of the power supply circuit 67 and the isolating circuit 68, these are known in the art and will not be detailed further.

In use, the AC input to each of the power-supplying units 3 is converted into DC power signals by the power supply circuits 67. The DC power signals pass through the respective isolating circuit 68 and the third and first connectors 61, 60 before reaching the DC output circuit 62 on the circuit board unit 5 and a DC output bus connected to the DC output circuit 62.

The control box 4 has a casing 41 inserted slidably and removably in the box-receiving compartment 400 in a direction from the open front side to the open rear side of the housing 2. A control circuit 410 is disposed in the casing 41, and includes a fourth connector 63 that projects rearward from a rear side of the casing 41 and that complements the second connector 64 on the circuit board unit 5. As such, when the control box 4 is disposed in the box-receiving compartment 400, the fourth connector 63 engages the second connector 64 to establish electrical connection between the control circuit 410 and the circuit board unit 5.

In this embodiment, the fourth connector 63 is an edge board of the control circuit 410, while the second connector 64 is an edge board connector. The control circuit 410 further includes a detecting and alarm generating circuit 65 and a load balancing circuit 66, both connected to the fourth connector 63. The detecting and alarm generating circuit 65 is operable so as to detect malfunctioning of any one of the power-supplying circuits 3, and so as to generate an alarm signal upon detecting the malfunctioning of any one of the power-supplying units 3. The load balancing circuit 66 operates to balance the power outputs of the power-supplying units 3. As to the detailed configuration of the detecting and alarm generating circuit 65 and the load balancing circuit 66, these are known in the art and will not be detailed further. The control circuit 410 additionally includes a power switch 69 mounted on the casing 41 and connected to the detecting and alarm generating circuit 65 and the load balancing circuit 66. The power switch 69 is operable so as to control the supply of an operating voltage to the detecting and alarm generating circuit 65 and the load balancing circuit 66.

Because the detecting and alarm generating circuit 65 and the load balancing circuit 66 are incorporated in the control box 4, and the isolating circuits 68 are incorporated in the power-supplying units 3, the design of the circuit board unit 5 is simpler as compared to that in the conventional power supplying apparatus 1 described beforehand. Only the first connectors 60 for establishing electrical connection with the power-supplying units 3, the second connector 64 for establishing electrical connection with the control circuit 410 of the control box 4, and the DC output circuit 62 are left on the circuit board unit 5. It will be described in the succeeding paragraphs that, when any one of the detecting and alarm generating circuit 65, the load balancing circuit 66, the power supply circuits 67, and the isolating circuits 68 fails, the defective control box 4 or power-supplying unit 3 is simply removed from the housing 2 to commence testing, repair and replacement of the same, thereby dispensing with the need to remove the circuit board unit 5 from the housing 2 and to shut down the entire power supplying apparatus of this invention.

Upon detection by the detecting and alarm generating circuit 65 that the power supply circuit 67 or the isolating circuit 68 of one of the power-supplying units 3 is malfunctioning, the detecting and alarm generating circuit 65 activates a corresponding indicating lamp 430 on a face plate 43 of the casing 41 of the control box 4, thereby generating the alarm signal to indicate the need to repair or replace the defective one of the power-supplying units 3. When repairing or replacing the defective power-supplying unit 3, it is only necessary to shut down the defective power-supplying unit 3. Thus, the other power-supplying units 3, which receive a respective AC input, and the control circuit 410 in the control box 4 resume their normal operations. When the defective power-supplying unit 3 is removed from the housing 2, the load balancing circuit 66 of the control box 4 ensures that the remaining power-supplying units 3 on the housing 2 generate balanced larger-than-normal power outputs to compensate for the reduction in the number of power-supplying units 3 on the housing 2. When a new power-supplying unit 3 is installed to replace the defective power-supplying unit 3, the load balancing circuit 66 ensures that all of the power-supplying units 3 on the housing 2 operate to provide a balanced normal power output. The detecting and alarm generating circuit 65 will cease to activate the corresponding indicating lamp 430 on the face plate 43 of the control box 4 at this time.

In a similar manner, when any one of the detecting and alarm generating circuit 65 and the load balancing circuit 66 of the control box 4 malfunctions, a corresponding indicating lamp 430 on the face plate 43 of the control box 4 is activated, thereby generating the alarm signal to indicate the need to repair or replace the control box 4. When repairing or replacing the control box 4, it is only necessary to turn off the power switch 69 on the face plate 43 of the control box 4 before removing the defective control box 4 from the box-receiving module 41 and replacing the defective control box 4 with a new one. The activated indicating lamp 430 on the face plate 43 of the control box 4 will be disabled once the new control box 4 has been installed. It is noted that normal operation of the power-supplying units 3 continues during replacement of the defective control box 4.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A power supplying apparatus, comprising:

a housing having an open front side, an open rear side, and a plurality of storage compartments and a box-receiving compartment that extend from said front side to said rear side;

a rear cover mounted on said housing to close said rear side, said rear cover having an inner surface with a circuit board unit mounted thereon, said circuit board unit having a plurality of first connectors, each of which is registered with a respective one of said storage compartments, a direct current output circuit connected to said first connectors, and a second connector registered with said box-receiving compartment and connected to said direct current output circuit;

a plurality of power supplying units, each of which is inserted removably in a respective one of said storage compartments, each of said power supplying units having a rear side provided with a third connector which complements a corresponding one of said first connectors that is registered with the respective one of said storage compartments, said third connector engaging the corresponding one of said first connectors to establish electrical connection with said circuit board unit, each of said power supplying units further having an internal power supply circuit adapted to receive an alternating current input and to convert the alternating current input into a direct current power signal, and an internal isolating circuit that interconnects said power supply circuit and said third connector, said isolating circuit preventing malfunction of said power-supplying unit from affecting normal operation of other ones of said power-supplying units; and a control box having a casing inserted removably in said box-receiving compartment, and a control circuit disposed in said casing, said control circuit including a fourth connector which projects rearward from a rear side of said casing and which complements said second connector, said fourth connector engaging said second connector to establish electrical connection with said circuit board unit, said control circuit further including a detecting and alarm generating circuit connected to said fourth connector and operable so as to detect malfunctioning of any one of said power-supplying units and so as to generate an alarm signal upon detecting the malfunctioning of any one of said power-supplying units, and a load balancing circuit connected to said fourth connector and operable so as to balance power outputs of said power-supplying units.

2. The power supplying apparatus as claimed in claim 1, wherein said control circuit further includes a power switch mounted on said casing and connected to said detecting and alarm generating circuit and said load balancing circuit, said power switch being operable so as to control supply of an operating voltage to said detecting and alarm generating circuit and said load balancing circuit.

3. The power supplying apparatus as claimed in claim 1, wherein said housing includes a plurality of container modules that are stacked one above the other and that confine said storage compartments, respectively.

4. The power supplying apparatus as claimed in claim 3, wherein said housing further includes a box-receiving module that is mounted on top of an uppermost one of said container modules and that confines said box-receiving compartment.

5. The power supplying apparatus as claimed in claim 3, wherein each of said container modules includes a base plate with opposite edges, and a pair of side plates that extend transversely from said opposite edges of said base plate.

6. The power supplying apparatus as claimed in claim 5, wherein each of said container modules further includes a pair of opposite slide rails that are attached respectively to inner sides of said side plates and that extend into said storage compartment, each of said power-supplying units having two opposite sides provided with a pair of slide members for sliding engagement with said slide rails in the respective one of said storage compartments.

* * * * *